(12) United States Patent
Cheng et al.

(10) Patent No.: US 8,709,890 B2
(45) Date of Patent: Apr. 29, 2014

(54) METHOD AND STRUCTURE FOR FORMING ETSOI CAPACITORS, DIODES, RESISTORS AND BACK GATE CONTACTS

(75) Inventors: Kangguo Cheng, Schenectady, NY (US); Thomas N. Adam, Slingerlands, NY (US); Ali Khakifirooz, Mountain View, CA (US); Alexander Reznicek, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 13/316,641

(22) Filed: Dec. 12, 2011

(65) Prior Publication Data

US 2013/0146953 A1    Jun. 13, 2013

(51) Int. Cl.
*H01L 21/8244* (2006.01)

(52) U.S. Cl.
USPC .......... 438/240; 438/155; 438/244; 438/250; 438/253; 257/296; 257/E27.112; 257/E27.113; 257/E21.008

(58) Field of Classification Search
USPC .......... 257/296, E27.112, E27.113, E21.008; 438/155, 240, 244, 250, 253
See application file for complete search history.

(56) References Cited

U.S. PATENT DOCUMENTS

| | | | |
|---|---|---|---|
| 6,346,446 B1 | 2/2002 | Ritenour | |
| 6,593,624 B2 | 7/2003 | Walker | |
| 6,881,627 B2 | 4/2005 | Forbes et al. | |
| 6,881,994 B2 | 4/2005 | Lee et al. | |
| 6,888,750 B2 | 5/2005 | Walker et al. | |
| 6,890,812 B2 | 5/2005 | Forbes et al. | |
| 6,894,532 B2 | 5/2005 | Forbes et al. | |
| 6,903,367 B2 | 6/2005 | Forbes | |
| 6,992,349 B2 | 1/2006 | Lee et al. | |
| 6,998,298 B1 | 2/2006 | Horch | |
| 7,015,525 B2 | 3/2006 | Forbes et al. | |
| 7,129,538 B2 | 10/2006 | Lee et al. | |
| 7,202,123 B1* | 4/2007 | Pan | 438/197 |
| 7,250,646 B2 | 7/2007 | Walker et al. | |
| 7,256,430 B1 | 8/2007 | Horch | |
| 7,288,807 B1* | 10/2007 | Akamatsu | 257/296 |
| 7,489,002 B2 | 2/2009 | Forbes et al. | |
| 7,525,137 B2 | 4/2009 | Walker et al. | |
| 7,563,715 B2 | 7/2009 | Haukka et al. | |
| 7,709,828 B2 | 5/2010 | Braithwaite et al. | |
| 7,776,697 B2 | 8/2010 | Currie et al. | |

(Continued)

FOREIGN PATENT DOCUMENTS

EP    WO02065522    8/2002
EP    WO03015171    2/2003

OTHER PUBLICATIONS

International Search Report/Written Opinion, PCT/US2012/049830; Mar. 29, 2013.

*Primary Examiner* — Robert Huber
(74) *Attorney, Agent, or Firm* — H. Daniel Schnurmann

(57) ABSTRACT

An ETSOI transistor and a combination of capacitors, junction diodes, bank end contacts and resistors are respectively formed in a transistor and capacitor region thereof by etching through an ETSOI and BOX layers in a replacement gate HK/MG flow. The capacitor and other devices formation are compatible with an ETSOI replacement gate CMOS flow. A low resistance capacitor electrode makes it possible to obtain a high quality capacitor, and devices. The lack of topography during dummy gate patterning are achieved by lithography in combination accompanied with appropriate etch.

20 Claims, 7 Drawing Sheets

(56) References Cited

U.S. PATENT DOCUMENTS

| | | |
|---|---|---|
| 7,825,455 B2 | 11/2010 | Lee et al. |
| 7,846,802 B2 | 12/2010 | Currie et al. |
| 7,851,861 B2 * | 12/2010 | Tu .................................. 257/350 |
| 7,884,353 B2 | 2/2011 | Currie et al. |
| 2011/0127608 A1 | 6/2011 | Cheng et al. |
| 2011/0175152 A1 | 7/2011 | Booth, Jr. et al. |
| 2011/0195557 A1 | 8/2011 | Teo et al. |
| 2011/0233643 A1 | 9/2011 | Chang |

* cited by examiner

METHOD AND STRUCTURE FOR FORMING ETSOI CAPACITORS, DIODES, RESISTORS AND BACK GATE CONTACTS

CROSS-REFERENCE TO RELATED APPLICATIONS

The present application is related to the application Ser. No. 13/316,635, of common assignee, filed concurrently, and incorporated by reference in all its details.

FIELD OF THE INVENTION

The present disclosure relates generally to extremely thin SOI semiconductor devices (ETSOI), and more specifically, to ETSOI on-chip capacitors, junction diodes, resistors and back gate contacts, all of which are constructed on an SOI substrate, integrated with ETSOI CMOS transistors, and found to be particularly useful for a variety of applications such as system-on-chip (SoC) applications.

BACKGROUND AND RELATED ART

To render ETSOI a true technology, ETSOI have been pursued as device architecture for continued CMOS scaling, this architecture extending to other semiconductor structures. With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors.

Nevertheless, performance improvement brought up by this type of "classic" scaling, in device dimensions, has recently met obstacles and in some cases even been challenged, when the scaling goes beyond a certain point, by the increase in leakage current and variability that are inevitably associated with the continued reduction in device dimensions. Planar transistors, such as metal oxide semiconductor field effect transistors (MOSFETs) are particularly well suited for use in high-density integrated circuits. As the size of MOSFETs and other devices decreases, the dimensions of source/drain regions, channel regions, and gate electrodes of the devices, also decrease.

Semiconductor-on-insulator (SOI) technology allows the formation of high-speed, shallow junction devices. In addition, SOI devices improve performance by reducing parasitic junction capacitance. In an SOI substrate, a buried oxide (BOX) film made of silicon oxide is formed on single crystal silicon, and a single crystal silicon thin film is formed thereon. Various methods of fabricating such SOI substrates are known, one of which is Separation-by-Implanted Oxygen (SIMOX) process, wherein oxygen ions are implanted into a silicon substrate at a desired depth to form a BOX film. The substrate is then annealed at high temperature, typically 1300° C. and an inert ambient with a small amount of oxygen, so that the oxygen-implanted region of the substrate is converted into silicon oxide. Another method of forming an SOI substrate is wafer bonding, wherein two semiconductor substrates with silicon oxide surface layers are bonded together at the silicon oxide surfaces to form a BOX layer between the two semiconductor substrates, followed by thinning ETSOI, a fully depleted device uses an ultra-thin silicon channel wherein the majority carriers are fully depleted (FD) during operation.

Referring to FIG. 1, there is shown a prior art illustrative structure of an FET device on a semiconductor-on-insulator (SOI) substrate having an extremely thin semiconductor-on-insulator (ETSOI) layer. The (ETSOI) layer 20 is formed on top of a buried insulating layer (BOX) 15 of the SOI substrate, with a thickness preferably ranging from 3 nm to 20 nm. Raised source and raised drain (RSD) 40 are formed on an upper surface of ETSOI layer in which the semiconductor is present, preferably formed using an epitaxial deposition process.

Due to the high resistance of the undoped extremely thin SOI body, prior ETSOI capacitors suffer from a high body resistance resulting in poor quality. This problem is not only limited to capacitors, but it extends to an entire family of other devices, passive or active, including resistors, diodes, back gate contacts, and the like. To render ETSOI a true technology, there is a need in industry for a high quality on-chip capacitor integrated with ETSOI CMOS transistors for a variety of applications such as system-on-chip (SoC) application.

SUMMARY

In one aspect, an embodiment of the invention provides a method and a structure forming semiconductor structures that includes, capacitors, junction diodes, resistors and back gate contacts integrated in an extremely thin SOI (ETSOI) transistor.

In another aspect, an embodiment provides capacitors formed by using a metal gate and a heavily doped raised source/drain (RSD), the capacitor being provided with two electrodes separated by a high-k gate dielectric as capacitor dielectric.

In another aspect, an embodiment of the invention provides a method and structure for integrating substrate formed by recessing the ETSOI and BOX in the diode region. The substrate pn junction diode with the metal gate as one contact to the first terminal, e.g., on the P side, the metal gate contact in the diode region is electrically isolated from the ETSOI and RSD region by the high-K gate dielectric and spacer.

In another aspect, an embodiment of the invention provides a back gate contact formed by recessing the ETSOI and BOX. The back gate patterning is formed by using the same mask as forming the actual gate. The back gate contact benefits by having the substrate contact perfectly self-aligned to the actual gate.

In another aspect, an embodiment of the invention provides a resistor located in a resistor region adjacent to the transistor region, wherein after removal of a dummy gate, recessing the ETSOI and BOX layers and forming an epitaxial growth to form the planar contact. The substrate contact is again perfectly self-aligned to the real gate.

BRIEF DESCRIPTION THE DRAWINGS

The following detailed description, given by way of example and not intended to limit the invention solely thereto, will best be appreciated in conjunction with the accompanying drawings, wherein like reference numerals denote like elements and parts, in which.

Figure 4A:
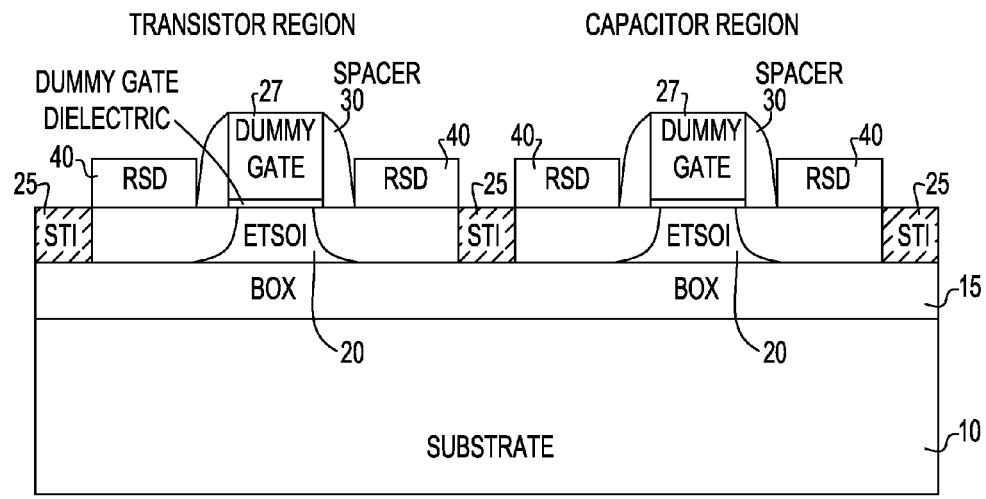
Figure 4B:
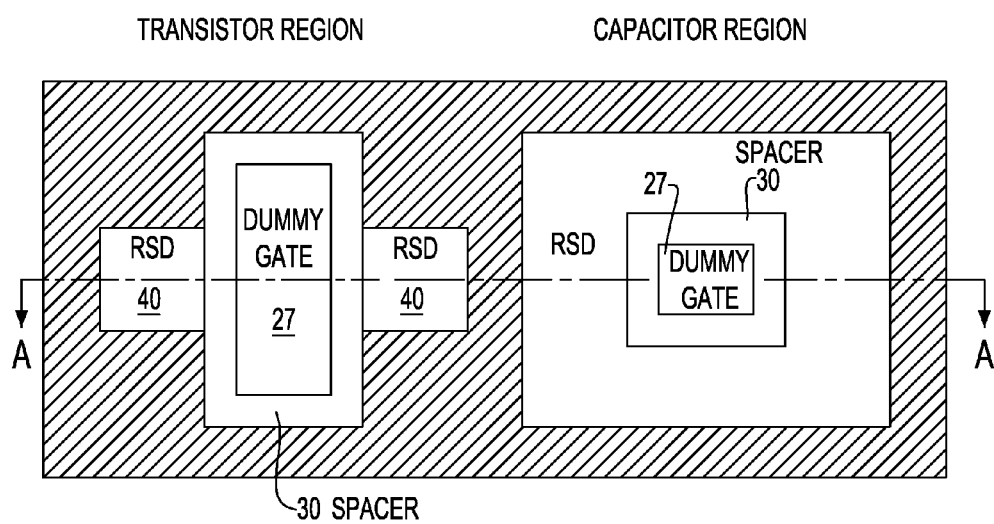
Figure 5A:
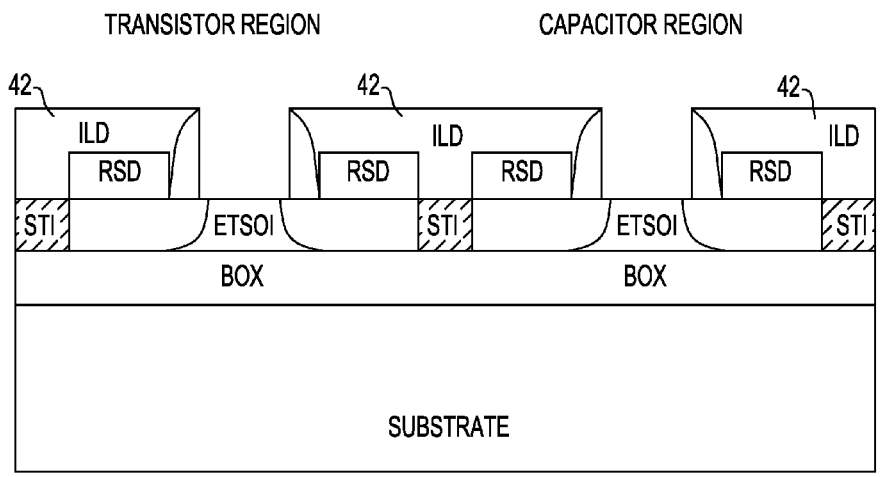
Figure 5B:
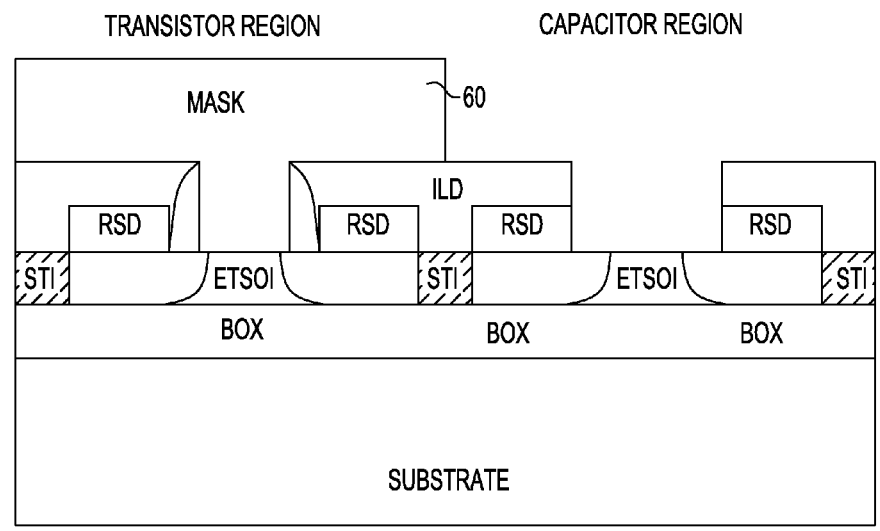

FIGS. 4a-4b respectively illustrate a perspective view and a top-down view of a transistor region and capacitor region separated from each other by an STI, each of which is provided with a dummy capacitor surrounded by a raised source and drain (RSD);

FIG. 5a is a side cross-sectional view of a demonstrative illustration of an interlevel dielectric layer (ILD) deposited and planarized, stopping at the dummy gates;

FIG. 5b depicts a side cross-sectional view showing a block mask covering the transistor region leaving the capacitor region exposed, and followed by removing spacers in capacitor regions.

Figure 6A:
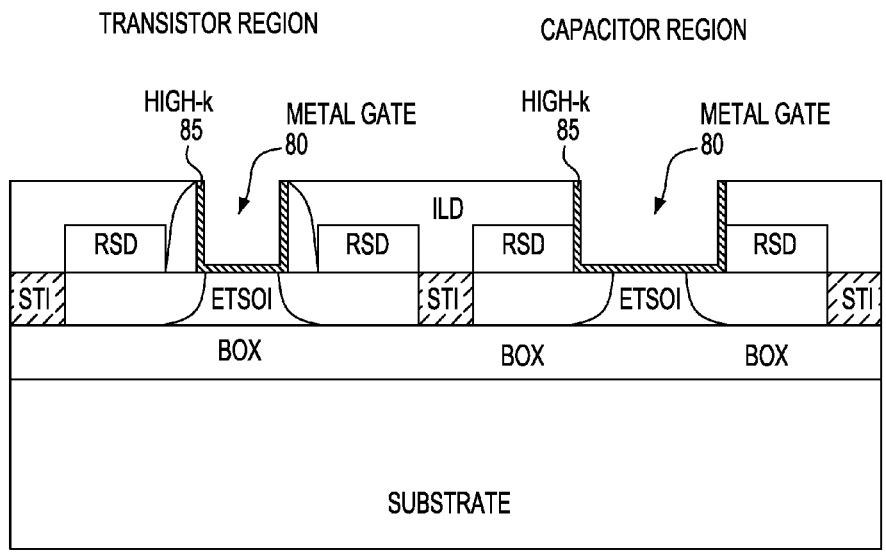
Figure 6B:
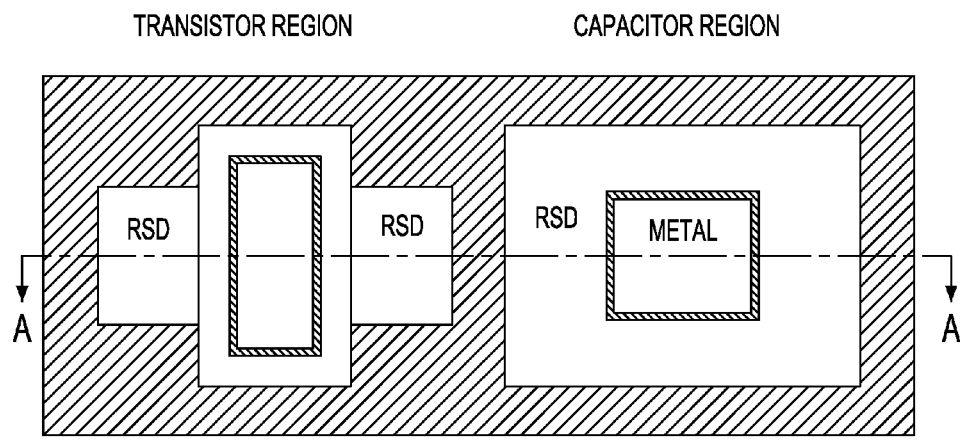
Figure 7:
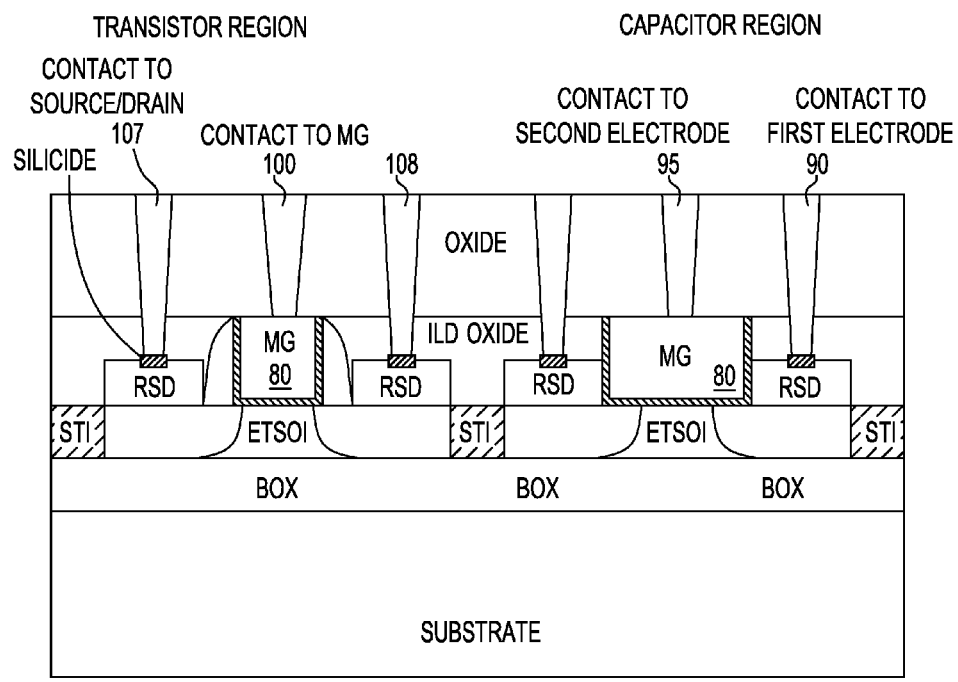
Figure 8:
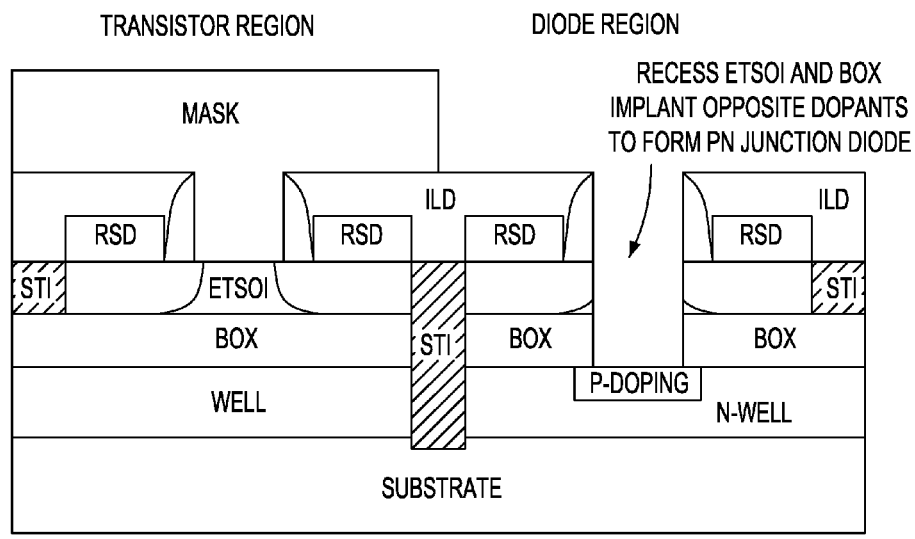
Figure 9:
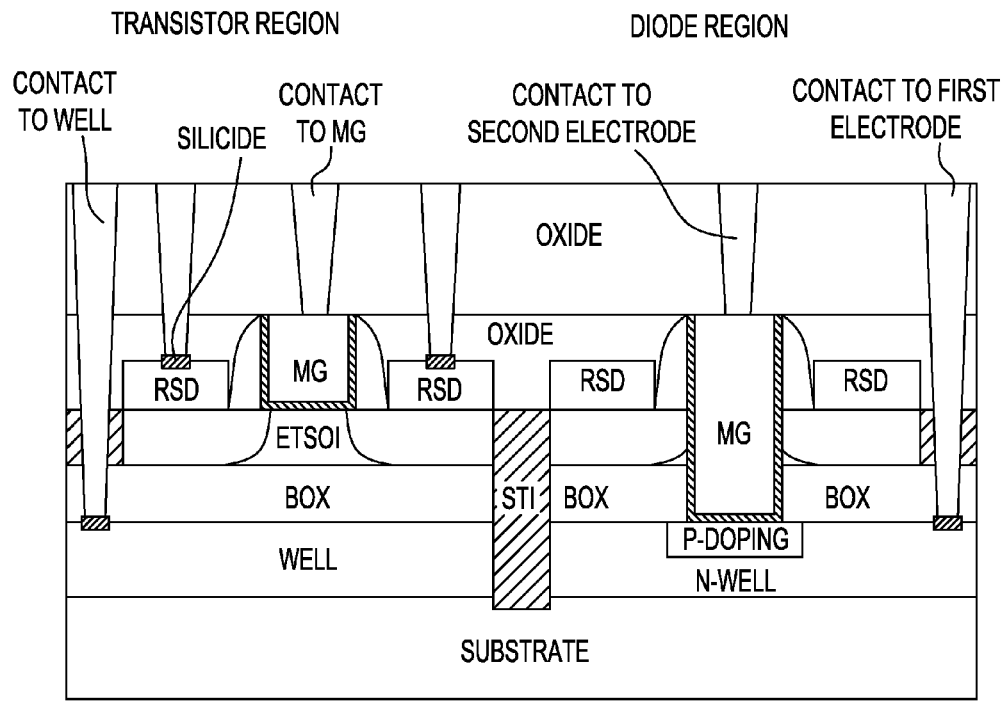
Figure 10:
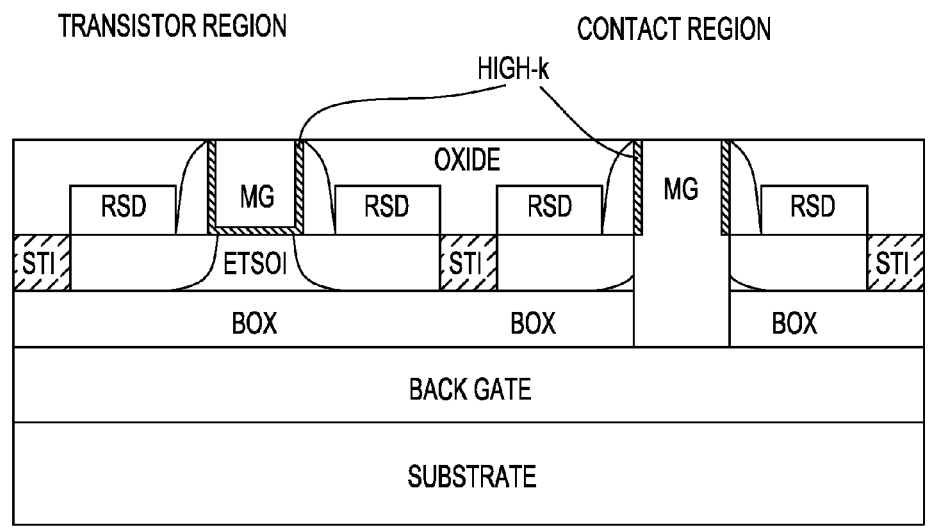
Figure 11:
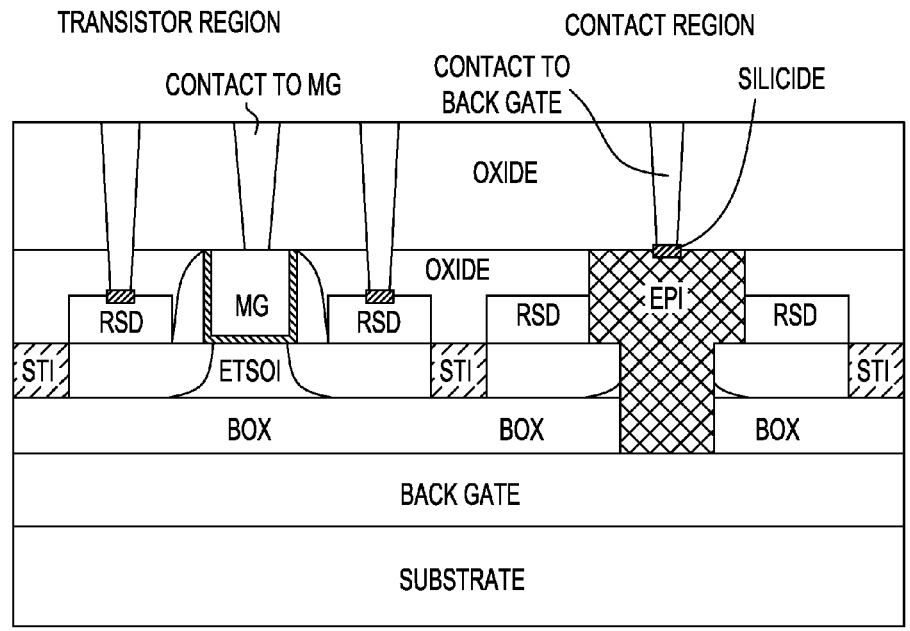
Figure 12:
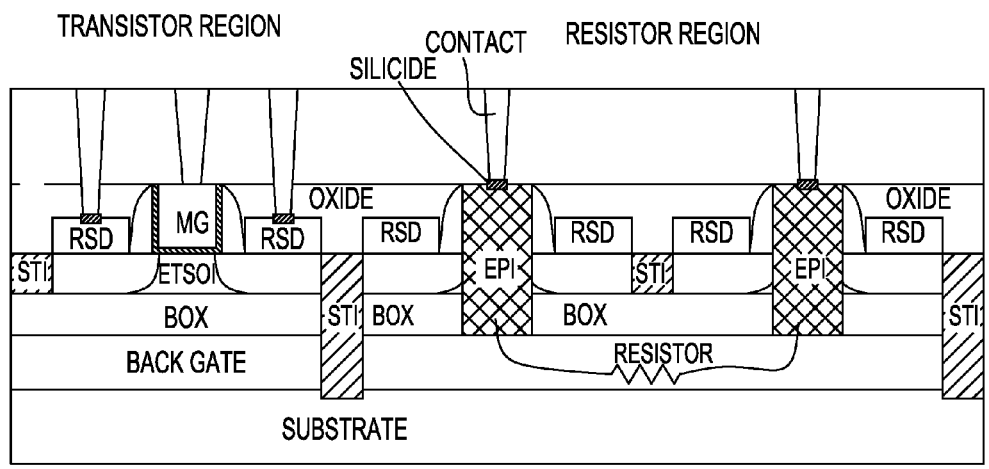

FIG. 6a-6b respectively illustrate a side cross-sectional view and a top-down view of the structure with the mask being removed from the transistor region followed by the deposition of a high-K (HK) dielectric and metal gate (MG), the ILD being omitted for clarity);

FIG. 7 is a side cross-sectional view showing the deposition of a dielectric and the formation of contacts to the metal gate, the source and drain and the back gate, forming the final capacitor design having a first and second electrodes separated by the high-k dielectric, in accordance with one embodiment of the invention;

FIG. 8 illustrates the formation of substrate diode formed by recessing the ETSOI and the BOX layer in the diode region, and implanting opposite dopants to form a pn junction diode, according to an embodiment of the invention;

FIG. 9 shows the final diode structure, illustrating the well becoming the first electrode, the metal gate becoming the second electrode, wherein the high-k becomes the diode dielectric, according to an embodiment of the present invention;

FIG. 10 shows a first back gate contact formed by recessing the ETSOI and BOX layer, wherein the back gate contact patterning is formed employing the same mask used to form the real gate, according to an embodiment of the present invention;

FIG. 11 shows a second embodiment of a back gate contact formed by recessing the ETSOI and BOX layer, having the epitaxial growth form the planar contact; and FIG. 12 illustrates a resistor located in an adjacent region to the transistor region, wherein following the removal of the dummy gate, recessing the ETSOI and BOX layers and forming an epitaxial growth are formed in the resistor region, filling the dummy gate in the transistor region with metal gate, according an embodiment of the invention.

DETAILED DESCRIPTION

Detailed embodiments of the present invention are disclosed hereinafter. It is to be understood that they are merely illustrative of the invention that may be embodied in various forms. In addition, each of the examples given in connection with the various aspects of the invention is intended to be illustrative, and not restrictive. Further, the figures are not necessarily drawn to scale, some features may be exaggerated to show details of particular components. Therefore, specific structural and functional details disclosed herein are not to be interpreted as limiting, but merely as a representative basis for teaching one skilled in the art to variously employ the present invention.

Figure 1:
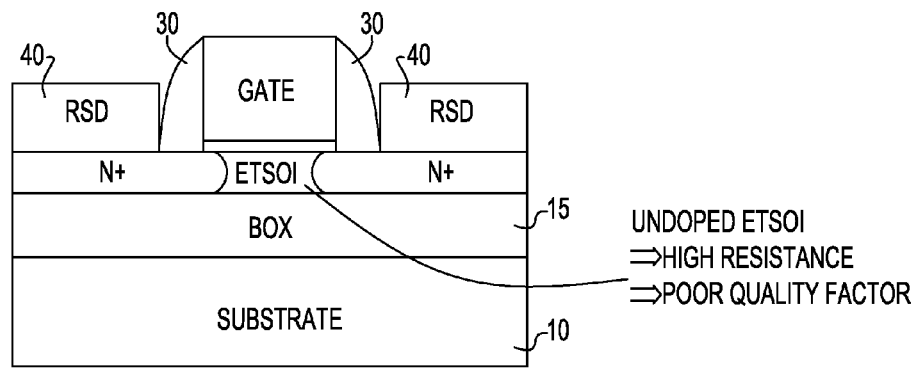
FIG. 1 is a side cross-sectional view of a prior art high body resistance undoped extremely thin SOI body with the ETSOI CMOS transistor having a raised S/D on an extension thereof.
Figure 2:
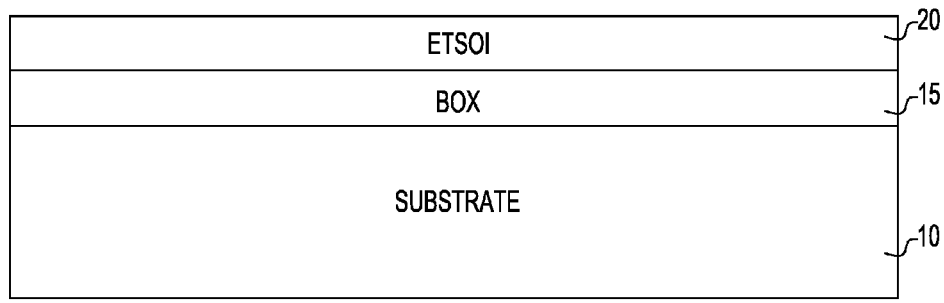
FIG. 2 illustrates a side cross-section of an SOI wafer having an ETSOI on a BOX layer superimposed on a substrate.

Referring to FIG. 2, an illustrative structure and a method for forming semiconductor FET devices on a semiconductor-on-insulator (SOI) substrate are described, the structure employing an extremely thin semiconductor-on-insulator (ETSOI) layer 20. The ETSOI layer is deposited directly on top of the buried insulating layer 15 of the SOI substrate, with a thickness preferably ranging from 2 nm to 20 nm, and more preferably varying from 4 to 10 nm.

The ETSOI layer 20 can be made of any semiconducting material including, but is not limited to Si, strained Si, SiC, SiGe, SiGeC, Si alloys, Ge, Ge alloys, GaAs, InAs, and InP, or any combination thereof. The ETSOI layer 20 can be thinned to a desired thickness by planarization, grinding, wet etch, dry etch, oxidation followed by oxide etch, or any combination thereof. Another method of thinning the ETSOI layer 20 consists of oxidizing silicon by a thermal dry or wet oxidation process, and then wet etching the oxide layer using, e.g., a hydrofluoric (HF) acid mixture. This process can be repeated to achieve the desired thickness. The ETSOI layer 20 can have a thickness ranging from 1.0 nm to 10.0 nm, or in another instance, a thickness ranging from 1.0 nm to 5.0 nm, or in still another, a thickness ranging from 3.0 nm to 8.0 nm.

The buried oxide (BOX) layer 15 on bulk substrate 10 can be made as a silicon oxide, a nitride, a silicon nitride, and/or an oxynitride, e.g., silicon oxynitride, having a thickness ranging from 5 nm to 1000 nm, or preferably, from 10 nm to 200 nm, and still more preferably, from 10 nm to 25 nm.

Still referring to FIG. 2, the SOI wafer can be made by wafer-bonding or SIMOX technique. The ETSOI layer may comprise any semiconducting material including, but not limited to Si, strained Si, SiC, SiGe, SiGeC, Si alloys, Ge, Ge alloys, GaAs, InAs, and InP, or any combination thereof.

Figure 3:
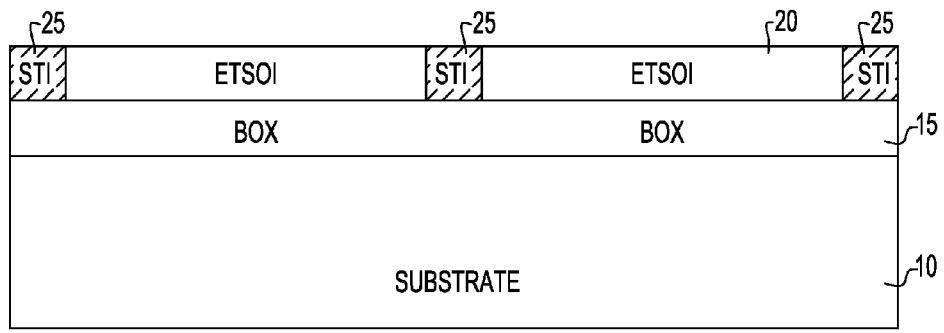
FIG. 3 shows a shallow trench isolation (STI) including patterning and filling the trenches with one or more insulators.

Referring to FIG. 3, an isolation can be formed by shallow trench isolation (STI) process including patterning (e.g., deposition a sacrificial pad layer (e.g., pad oxide and pad nitride), patterning (e.g., by lithography) and etching STI trenches 25 (e.g., by reactive ion etch (RIE), filling the trenches with one or multiple insulators including but not limited to oxide, nitride, oxynitride, high-k dielectric, or any suitable combination of those materials. A planarization process, such as chemical-mechanical polishing (CMP), may optionally be used to provide a planar structure. Besides STI 25, other isolation such as mesa isolation, local oxidation of silicon (LOCOS) can also be used. The sacrificial pad oxide and pad nitride can then be striped.

Referring to FIG. 4a, a dummy gate 27 is formed in the transistor region and the capacitor region. The dummy gate dielectric may include silicon oxide formed by oxidation, with a thickness ranging from 1 nm to 5 nm. The dummy gate may include polysilicon formed by deposition, such as chemical vapor deposition (CVD), with a thickness ranging from 10 nm to 70 nm, and more preferably 20-50 nm. The dummy gate 27 may further include a silicon nitride cap on top of the polysilicon. Silicon nitride can be formed by CVD deposition, with a thickness ranges from 5-50 nm, and more preferably from 20-30 nm. The dummy gate is formed by conventional patterning and etching processes. Embodiments with other materials suitable for dummy gate are also conceived.

Spacers 30 are then formed, typically composed of dielectric materials, and preferably formed using a blanket layer deposition and anisotropic etchback. Although the spacers are depicted in the figures as each using a single layer, embodiments have been contemplated in which each spacer may be formed as a multi-layered structure of dielectric materials. In one embodiment, spacers are preferably formed by depositing a film (e.g., silicon nitride) formed by RIE. The spacer thickness may range from 3-20 nm, and more preferably from 4 to 8 nm.

An epitaxially grown raised source/drain (RSD) 40 and an extension thereof are formed with the RSD preferably made of Si or SiGe. It can be formed by way of in-situ doped or doped following the epitaxy, preferably by implantation and plasma doping. The RSD thickness varies from 10-30 nm. Extension can be formed by implantation or by driving dopants from the in-situ doped RSD.

More particularly, the diffusing dopant from the in-situ doped semiconductor material of the raised source region and the raised drain region into the ETSOI layer 20 to form extension regions 40. The dopant from the in-situ doped semiconductor material is diffused into the ETSOI layer 20 by an annealing processes including, but not limited to rapid thermal annealing, furnace annealing, flash lamp annealing, laser annealing, or any suitable combination thereof. Thermal annealing to diffuse the dopant from the in-situ doped semiconductor material into the ETSOI layer 20 is conducted at a temperature ranging from 850° C. to 1350° C.

In-situ doped semiconductor material is doped to a p-type conductivity, the extension regions 40 that are formed in the ETSOI layer 20, the dopant concentration of the extension regions 40 having the p-type conductivity ranges from $1\times10^{19}$ atoms/cm$^3$ to $2\times10^{21}$ atoms/cm$^3$. The extension regions 45 can made having a material with a dopant concentration ranging from $2\times10^{19}$ atoms/cm$^3$ to $5\times10^{20}$ atoms/cm$^3$.

Extension regions 40 can have a depth that extends to the entire depth of the ETSOI layer 20, with a depth preferably less than 10 nm, and typically 2 nm to 8 nm, measured from the upper surface of the ETSOI layer 20. Although the extension regions 40 previously described are formed by diffusing dopant from the raised source region and the raised drain region into the ETSOI layer 20, the extension regions 45 may also be formed by ion implanting of n-type or p-type dopants into the ETSOI layer 20 after forming dummy gate 27, and before forming the raised S/D regions 40.

Referring now to FIG. 4b, a top-down view of the structure as it stands with regard to FIG. 4a is illustrated highlighting the dummy gates 27 surrounded by spacers 30, and RSD 40 on the transistor region and capacitor region.

Referring to FIG. 5a, a deposition and planarization of an interlevel dielectric 42 (ILD, e.g., oxide) follow, stopping at the dummy gate. The deposition can be performed using CVD, by spin-on coating, and the like. The planarization can be done preferably using a chemically mechanical polish (CMP). This process is then followed by removing the dummy gates 27.

Referring to the removal of dummy gates 27, a silicon nitride cap, if used, can be removed by etching, preferably by dry etch (e.g., RIE), or wet etch, e.g., by way of hot phosphoric acid. The polysilicon can be removed by dry etch (e.g., RIE) or wet etch (e.g., TMAH or ammonia), and the dummy gate oxide removed by hydrofluoric acid or chemical oxide removal.

The wet etch process is preferably performed with an etch solution containing hydrofluoric in the presence of silicon oxide and, alternatively, using a dry etch such as chemical oxide removal (COR) to etch the polysilicon and dummy gate oxide.

In one demonstrative illustration, the chemical oxide removal (COR) process may include exposing the structure to a gaseous mixture of hydrofluoric acid (HF) and ammonia (NH4OH). The ratio of hydrofluoric acid (HF) to ammonia (NH4OH) in the chemical oxide removal (COR) process may range from 2.25:1 to 1.75:1 at a pressure between 0.75 mTorr and 15 mTorr at approximately room temperature (25° C.). In one example, the ratio of hydrofluoric acid (HF) to ammonia (NH4OH) in the chemical oxide removal (COR) is 2:1, at a pressure between 1 mTorr and 10 mTorr and a temperature of about 25° C. During this exposure, HF and ammonia gases react with the sidewall residue that is present on the exposed surface of the dielectric film from the etch process that produced the dummy gate to form a solid reaction product. The solid reaction product can be removed in a second step which includes heating the structure to a temperature greater than about 90° C., e.g., 100° C., thus causing the reaction product to evaporate. The reaction product may be removed by rinsing the structure in water, or removing with an aqueous solution.

Referring to FIG. 5b, a block mask 60 is used to cover the transistor region and expose the capacitor region. The mask 60 can be a soft mask, i.e., photoresist formed by photolithography. If, alternately, a hard mask is used, a photoresist material is applied over the masking layer to effect patterning the hard mask layer. The mask 60 can be a softmask (photoresist) formed by photolithography. At this stage, the spacers using any suitable etch process. For example, in the case wherein the spacers include silicon nitride, a dry etch such as chemical downstream etch (CDE) or wet etch with an aqueous solution containing hot phosphoric acid can be used to remove silicon nitride. Next, the mask (photoresist) 60 is removed, preferably using a dry strip (plasma etch) or a wet strip (e.g., by sulfuric peroxide).

Referring to FIG. 6a, a high-k dielectric 85 and metal gate (MG) 80 are deposited. The high-k dielectric material is advantageously deposited by standard methods, such as atomic layer deposition (ALD) or chemical vapor deposition (CVD). Alternatively, the dielectric material may include silicon containing dielectric material deposited by chemical vapor deposition, such as low pressure chemical vapor deposition (LPCVD) and optionally, in combination with chemical oxidation, thermal oxidation and/or thermal nitridation.

With reference to the capacitor, the heavily doped RSD becomes the first electrode, metal gate 80 becomes the second electrode, and the high-k 85 on the sidewalls of RSD becomes the capacitor dielectric. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum or aluminum.

Examples of metal gate include tungsten, titanium, tantalum, ruthenium, zirconium, cobalt, copper, aluminum, lead, platinum, tin, silver, gold, a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition.

Referring to FIG. 6b, a top-down view of the structure is shown at the phase previously described in the cross-section of the perspective view shown in FIG. 6a. The capacitor and the transistor are shown with the gate metal surrounded by the dielectric, wherein the ILD layer has been removed for clarity.

The present embodiment illustrates the structure in the absence of a back gate layer, leaving the BOX layer directly superimposed over the substrate, and extending preferably from the beginning of the transistor region abutting to the end of the capacitor region.

Referring to FIG. 7, the dielectric (e.g., oxide) 42 is deposited, preferably using CVD, spin-on coating, and the like. Contact to the metal gate 100, source and drain (S/D) 107, 108, and silicide on S/D can be formed either before or during the contact formation.

The contacts are formed by patterning preferably by way of photolithography; by first etching contact trenches, preferably using RIE; filling the trenches with conductive material, such as tungsten; and planarizing the top surface, preferably using CMP.

The conductive material can be, but is not limited to a doped semiconductor material (e.g., polycrystalline or amorphous silicon, germanium, and a silicon germanium alloy), a metal (e.g., tungsten, titanium, tantalum, ruthenium, cobalt, copper, aluminum, lead, platinum, tin, silver, and gold), a conducting metallic compound material (e.g., tantalum nitride, titanium nitride, tungsten silicide, tungsten nitride, titanium nitride, tantalum nitride, ruthenium oxide, cobalt silicide, and nickel silicide), or any suitable combination of these materials.

Still referring to FIG. 7, the low resistance capacitor having the highly doped RSD is structured as follows: the metal gate (MG) 95 becoming the $1^{st}$ electrode, the highly doped RSD becoming the $2^{nd}$ electrode 90, and the high-k 85, the capacitor dielectric. The capacitor is thus formed between the metal gate 80 and the now extended (i.e., due to the absence of the sidewall) including the highly doped RSD with the high-k 85 acting as capacitor dielectric.

Referring now to FIG. 8, the formation of a substrate diode formed by recessing the ETSOI and BOX integrated in the diode region. The structure applies to a junction diode that advantageously uses the similar construction described previously for the capacitor, using FIG. 5a as the point of departure. Shown therein are illustrated two regions, a transistor region and a diode region adjacent thereto. Dummy gates are formed respectively in each region, the dummy gate being superimposed to the dummy gate dielectric with the dielectric directly on top of the ETSOI. Spacers surround the dummy gate, as previously illustrated with reference to FIG. 4b. An RSD is preferably epitaxially grown, forming an extension respectively abutting at the spacers. Unlike the capacitor having the BOX on top of the substrate, the present diode structure places the BOX on top of a well superimposed on the substrate.

Wells below the BOX are formed preferably as a common well formed by way of implantation. Both the transistor and diode regions are separated from one another using the STI extend to the top surface of the substrate. An interlevel dielectric (ILD) is deposited preferably by CVD and planarized, e.g., using CMP. The dummy gates are then removed by etching using a dry or wet etch. A block mask, preferably a soft mast (e.g., photoresist) is then formed by photolithography, covering the transistor region, while leaving the diode region exposed.

Next, in the diode region, the ETSOI and BOX are recessed, implanting opposite dopants into the well to form the pn junction using a doping concentration higher than the original well doping concentration to form the pn junction diode. By way of example, if the well has n-type dopants such as phosphorous having a doping concentration of $5\,e^{18}\,cm^{-3}$, boron is implanted into the well having a doping concentration of $2\,e^{19}\,cm^{-3}$.

Referring to FIG. 9, the mask can be removed by dry strip (i.e., plasma etch) or a wet strip, preferably by way of sulfuric peroxide). A high-K dielectric is then deposited followed by forming the metal gate (MG). For the diode, the well (doped region below the BOX) becomes the first diode terminal, the opposite doped region in the original well becomes the second diode terminal, and the metal gate serves as the contact to the second diode terminal.

Referring to FIG. 10, in one embodiment, a substrate contact is formed by recessing the ETSOI and BOX layers, and can be formed with the same mask used to form the real gate, leaving the substrate contact perfectly self-aligned with the real gate.

The initial point of departing shows the ETSOI layer on top of the BOX, superimposed on top of the back gate layer directly over the substrate, as recited in application Ser. No. 13/316,635, herein incorporated by reference.

The same dummy gates surrounded by spacers are formed in the transistor region with the contact region being separated from one another by an ST. An RSD is then epitaxially grown forming the extension, and the ILD dielectric is deposited stopping at the dummy gates. The dummy gates are then removed by etching, and followed by depositing the high-k dielectric. Upon blocking the transistor with a mask, the contact region left exposed is recessed by RIE on the high-k dielectric, the ETSOI layer and the BOX.

Referring to FIG. 11 following removal of the mask, metal gate is formed to form metal gate in the transistor region and the metal gate in the back gate contact region serves as the contact to the back gate.

FIG. 12 shows an embodiment of a second back gate contact formed by recessing the ETSOI and BOX layer, wherein the epitaxial growth forms a planar contact, according to an embodiment of the present invention.

At the stage of blocking the transistor using a mask after removing the dummy gate as previously described, the contact region left exposed can be recessed, preferably by RIE, the ETSOI layer and the BOX.

The back gate contact differs from the original embodiment, by letting the dummy gate in the contact region to be removed by etching including the removal of the spacers, and by letting the recessed area not only to extend till the back gate but also by letting the epitaxial growth fill the entire recessed area of the contact region. Only then, it is to be followed by depositing therein the high-k dielectric. The epitaxial grows back to form a contact to the back gate, with the epitaxial layer doped, in-situ, ex-situ such as implantation, or combination of in-situ and ex-situ, to lower the resistance. The mask is then removed from the transistor region, and a metal gate is used having a high-k separating the ETSOI channel from the MG.

Contacts to the metal gate are then formed, including S/D and back gate, siliciding the epitaxial growth such that the source/drain and epitaxial growth in the contact region can be formed either before or during the formation of the contact. The contacts are patterned, e.g., using photolithography, etching the contact trenches and filling the trenches with conductive material, preferably using tungsten and having the top surface of the oxide planarized, e.g., by CMP.

FIG. 13 provides a resistor integrated in a resistor region adjacent to the transistor region, following the removal of the dummy gate, recessing the ETSOI and BOX layers and forming an epitaxial growth, and filling the dummy gate in the transistor region with metal gate, according an embodiment of the invention.

The point of departure for the resistor is similar to the schematic diagram depicted with reference to FIGS. 10 and 11. The transistor and resistor regions are isolated from one another by STI. The same block master used previously is once again employed for covering the transistor region, while leaving the resistor region exposed. Etching is then used to recess both the ETSOI and the BOX, the etching abutting to the bottom top surface of the BOX. Optionally, an epitaxy is then grown to fill the recessed areas. The mask is then removed from the transistor area. A high-k dielectric is conformally deposited following the formation of the metal gate. The dielectric, preferably an oxide is then deposited across both regions, followed by the contacts to the metal gate, the S/D and the back gate, with the S/D preferably silicided either before or after formation of the contacts. As previously described, the contacts are formed by patterning, e.g. photolithography, etching the contact trenches by RIE, filling the trenches with tungsten and planarizing by CMP. The resistor is shown between the two epitaxially filled trenches in the resistor region. In this case, the resistance of the epitaxial material in the trenches and the resistance of the well below BOX contribute to the resistance of the resistor. Alternatively, trenches are filled with metal and the resistance of the resistor primarily comes from the resistance of the well below BOX.

In summary, embodiments of the present invention describe a plurality of devices including capacitors, substrate junction diode, various versions of back gate contacts, and a resistor. In all instances, no topography is used while dummy gate patterning, it enables both the lithography and the etching, all of which are user friendly.

While the structures and the methods disclosed herein have been particularly shown and described with respect to preferred embodiments thereof, it will be understood by those skilled in the art that the foregoing and other changes in forms and details may be made without departing from the spirit and scope of the present disclosure. It is therefore intended that the methods and structures disclosed herein not be limited to the exact forms and details described and illustrated, but fall within the scope of the appended claims.

What is claimed is:

1. A method of forming semiconductor structures on a semiconductor-on-insulator (SOI) substrate comprising:
    forming in a first region an extremely thin semiconductor-on-insulator (ETSOI) transistor on an ETSOI layer superimposed on a buried oxide (BOX) layer, said ETSOI transistor comprising a dummy gate bounded by a spacer and raised source and drain (RSD) abutting at said spacer;
    replacing said dummy gate by depositing a high-k dielectric followed by depositing a metal gate thereon; and
    forming in a second region coplanar to said ETSOI transistor, one or more capacitors having a first electrode formed by said doped RSD region of said ETSOI, a second electrode formed by said metal gate, having said high-K dielectric separating said first electrode from said second electrode;
    forming at least one pn junction diode by selectively recessing said ETSOI and said BOX, filling said junction diode with said metal gate forming one contact to a first terminal, wherein said metal gate contact is electrically isolated from said ETSOI and RSD by said high-K gate dielectric and spacer;
    forming one or more back gate contact by recessing said SOI and said BOX, and epitaxially growing back to form a planar contact; and
    forming one or more resistors following said replaced dummy gate, by recessing said ETSOI and said BOX layers and filing said recesses using an epitaxial growth.

2. The method of claim 1, wherein forming said high-K dielectric uses metal oxides.

3. The method of claim 1, wherein forming said ETSOI transistors is concentrated in a first region, and said capacitors, junction diodes, back gate contacts or resistors are formed in a second region.

4. The method of claim 1 further comprising isolating said ETSOI transistor from said capacitors, pn junction diodes, back contacts or resistors by shallow trench isolation (STI).

5. The method of claim 1 wherein forming said ETSOI transistor and said capacitor comprise replacing said dummy gates respectively by metal gates.

6. The method of claim 5 further comprises forming said capacitor by having a heavily doped RSD that becomes a first electrode, a metal gate that becomes a second electrode, and a high-k dielectric on sidewalls of said RSD that becomes a capacitor dielectric.

7. The method of claim 1, wherein forming said capacitors comprises forming metal-insulator-semiconductor (MIS) capacitors.

8. The method of claim 1 further comprising forming spacers surrounding said metal gate of said ETSOI transistor, exposing walls of said capacitor gate.

9. A method of forming an on-chip semiconductor structure comprising:
    forming on an ETSOI layer of an SOI substrate, a first dummy gate in a transistor region and a second dummy gate in a capacitor region, surrounding each of said dummy gates by spacers;
    forming on said ETSOI layer a raised source and drain (RSD), said RSD abutting at said spacers;
    removing by etching said first dummy gate from said transistor and said capacitor regions;
    forming a trench in each of said transistor and capacitor regions;
    depositing high-k dielectric followed by metal gate in each of said removed dummy gates in said transistor sand capacitor regions;
    forming said on-chip semiconductor structure further comprising at least one of any number and combination of steps comprising:
    Step A: one or more capacitors isolated from said ETSOI transistor coplanar with said ETSOI transistor and having a first electrode formed by a highly doped RSD region of said ETSOI, forming a second electrode by said metal gate with said high-K dielectric separating said first electrode from said second electrode;
    Step B: one or more diodes by recessing said ETSOI and said BOX, filling said pn junction diode with said metal gate as one contact to a first terminal, wherein said metal gate contact is electrically isolated from said ETSOI and RSD by said high-K gate dielectric and spacer;
    Step C: one or more back gate contacts formed by recessing said SOI and said BOX, and said epitaxial grow back to form a planar contact; and
    Step D: one or more resistors following said removal of said dummy gate, by recessing said ETSOI and said BOX layers and forming an epitaxial growth.

10. The method of claim 9, wherein following said forming said RSD further comprises depositing and planarizing an interlevel dielectric layer, abutting at said dummy gate.

11. The method of claim 9, wherein removing said dummy gates is performed by dry or by wet etching.

12. The method of claim 9 further comprising covering said transistor region by a block mask, leaving said capacitor region exposed.

13. The method of claim 12, further comprising removing said block mask.

14. The method of claim 12, further comprising using photoresist to remove said block mask using plasma etch to dry strip or to wet strip using sulfuric peroxide.

15. The method of claim 9 further comprising forming a capacitor using a first electrode formed by a back gate below a BOX of said SOI substrate; a second electrode formed by said metal gate; and said high-K dielectric forming a capacitor dielectric.

16. The method of claim 9 further comprising forming contacts to said metal gates, raised source and drain.

17. The method of claim 9 wherein said recessed dummy gate, ETSOI and BOX layers expose a heavily doped back gate region.

18. The method of claim 9 wherein said high-k and said metal gate are formed by a replacement high-k and metal gate process.

19. The method of claim 9 wherein said high-K dielectric is made of metal oxide or dielectric materials.

20. The method of claim 9 wherein said RSD are grown epitaxially, forming an extension.

* * * * *